United States Patent [19] [11] 3,876,944
Mack et al. [45] Apr. 8, 1975

[54] DIBINARY ENCODING TECHNIQUE

[75] Inventors: Donald E. Mack, Rochester; Donald A. Perreault, Pittsford, both of N.Y.

[73] Assignee: Xerox Corporation, Rochester, N.Y.

[22] Filed: Aug. 6, 1970

[21] Appl. No.: 61,815

Related U.S. Application Data

[63] Continuation of Ser. No. 656,496, July 27, 1967, abandoned.

[52] U.S. Cl. ............ 325/141; 178/DIG. 3; 178/67; 325/38 A; 340/347
[51] Int. Cl. ............ H04n 1/20
[58] Field of Search ............ 340/347; 325/38, 38 A, 325/141, 67; 178/67, 68; 235/154

[56] References Cited

UNITED STATES PATENTS

| | | | |
|---|---|---|---|
| 2,700,696 | 1/1965 | Barker | 340/347 |
| 3,149,323 | 9/1964 | Aaron et al. | 340/347 |
| 3,154,777 | 10/1964 | Thomas | 346/347 |
| 3,305,854 | 2/1967 | Witt | 325/38 |

OTHER PUBLICATIONS

I.B.M. Technical Disclosure Bulletin; Vol. 6, No. 9, Feb. 1964, An RZ1 Coding and Implimention, Hopner & Johnson, Jr.

*Primary Examiner*—George H. Libman
*Assistant Examiner*—Barry L. Leibowitz

[57] ABSTRACT

Logic circuitry for changing the power spectral density of two level non-synchronous electrical signals. The power of the electrical signals is concentrated at the lower frequencies to thereby make possible more efficient use of band limited channels which normally exhibit increasing distortion of their transfer functions as the band edges are approached. The logic circuitry includes a decision circuit which performs a predetermined probability operation of enabling either of logic gate circuits, thereby transferring positive portions of an input waveform as positive or negative signals with equal probability. The zero portions of the original waveform are unaltered. The output waveform is a three-level "dibinary" signal directly corresponding to the two-level input non-synchronous signals.

22 Claims, 9 Drawing Figures

INVENTORS
DONALD E. MACK
DONALD A. PERREAULT
BY Ronald Zibelli
Franklyn C. Weiss
ATTORNEYS INVENTORS
DONALD E. MACK
DONALD A. PERREAULT
BY Ronald Zibelli
Franklyn C. Weiss
ATTORNEYS INVENTORS
DONALD E. MACK
DONALD A. PERREAULT
BY Ronald Zibelli
Franklyn C. Weiss
ATTORNEYS INVENTORS
DONALD E. MACK
DONALD A. PERREAULT
BY Ronald Zibelli
Franklyn C. Weiss
ATTORNEYS INVENTORS
DONALD E. MACK
DONALD A. PERREAULT
BY Ronald Zibelli
Franklyn C. Weiss
ATTORNEYS

DIBINARY ENCODING TECHNIQUE

This application is a continuation of application Ser. No. 656,496, filed July 27, 1967, now abandoned.

BACKGROUND

Transmission channels have two dimensions which determine the rate at which data can be transmitted, e.g., the "width" in the frequency domain in Hertz, i.e. bandwidth, and the "depth" in terms of power, usually stated as "signal to noise ratio." It is known that the data rate of a channel can be increased over the binary capability by encoding the data into more than two levels, thereby increasing the depth of the signal to take advantage of the depth of the channel without further increasing the bandwidth of the signal. This technique has become quite common in recent years as demands for data rates exceeding the binary capability of channels have grown.

A common method known as Nyquist encoding is to transform $n$ bits into $2^n$ levels. Each level thereby represents a binary number and the transmitted level is thereby uniquely decodable at the receiver. By transforming the binary data into non-binary data characters it is also possible to encode into L levels where L is not equal to $2^n$. These techniques are usually less than 100 percent efficient since in general integers m and n do not exist such that $2^n$ equals $R^m$ where R is some other radix than two. A third method is to introduce correlation between the transmitted symbols by making the level transmitted depend not only on the bit or bits to be transmitted during a given interval but also on the bit or bits transmitted during a previous interval or intervals. In this case the transmitted levels cannot in general be uniquely decoded at the receiver but must be stored and compared with subsequent symbols. In some cases proper pre-encoding, binary to binary, can produce uniquely decodable multilevel symbols. A well-known embodiment of this latter technique is the recently developed "Duobinary Data Transmission System" as disclosed by Adam Lender in Communications and Electronics, May 1963, Pages 214 to 218.

All of the above techniques require that the binary data be "clocked" or separated into discrete time elements, i.e. bits, so that the information can be handled and encoded according to the states of the individual bits, using conventional logic circuitry. As far as is known, no technique has been developed for the multilevel encoding of unclocked, i.e. non-synchronous, two level signals such as arise in black and white facsimile systems.

OBJECTS OF THE INVENTION

It is, accordingly, an object of the present invention to optimize the information handling capability in a data transmission system.

It is another object of the present invention to provide multilevel encoding of unclocked two-level data signals.

It is another object of the present invention to provide for multilevel encoding of non-synchronous two-level signals.

It is another object of the present invention to concentrate the power spectral density of non-synchronous electrical signals at lower frequencies in order to avoid approaching the bandwidth limitation of the transmission medium.

BRIEF SUMMARY OF THE INVENTION

In accomplishing the above and other desired aspects, applicants have invented novel methods and apparatus for generating a three-level data signal from a two state data signal in order to concentrate the power density of the data information to lower frequencies in order not to approach the bandwidth limitation of the transmission medium. Two-level input data signals and the negative image thereof are applied to transmission gates controlled by decision logic. The decision logic performs a random, i.e. 50–50, probability operation of enabling either of the transmission gates thereby transferring the positive portions of the original waveform as positive or negative signals with equal probability. The zero portions of the original waveform are unaltered. The output waveform is a three-level dibinary signal directly corresponding to the two level input non-synchronous signals.

DESCRIPTION OF THE DRAWINGS

For a more complete understanding of applicants' invention, reference may be had to the following detailed description in conjunction with the drawings wherein.

DETAILED DESCRIPTION OF THE INVENTION

Figure 1:
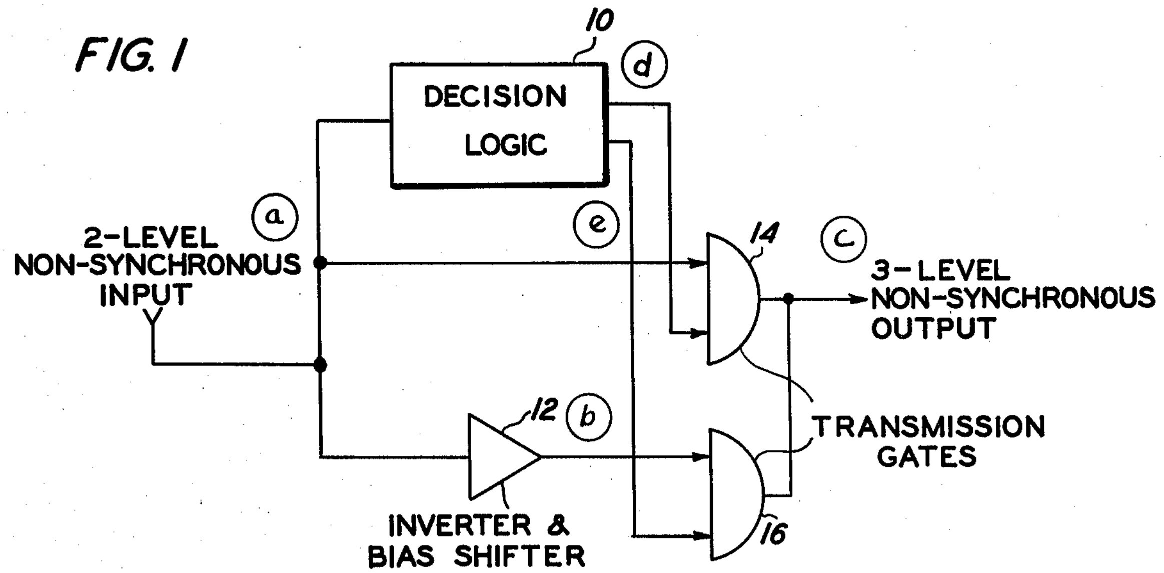
FIG. 1 is a block diagram of the invention in accordance with the principles thereof.

Referring now to FIG. 1, there is shown the overall circuitry for producing a three-level non-synchronous dibinary signal from a two-level non-synchronous signal. The two-level input data signal and its negative image, not merely the logical inverse, formed by inverter and bias shifter 12 are applied to transmission gates 14 and 16 which are controlled by decision logic 10. Whenever a positive going transition occurs in the original data waveform, the decision logic 10 decides at a random, i.e. 50–50, probability which transmission gate to enable. The result is that each positive portion of the original waveform has equal probability of being transmitted as positive or negative. The zero portions of the original waveform are unaltered. The output is thus a three-level signal whose non-zero portions are equally likely to be positive or negative.

Figure 2:
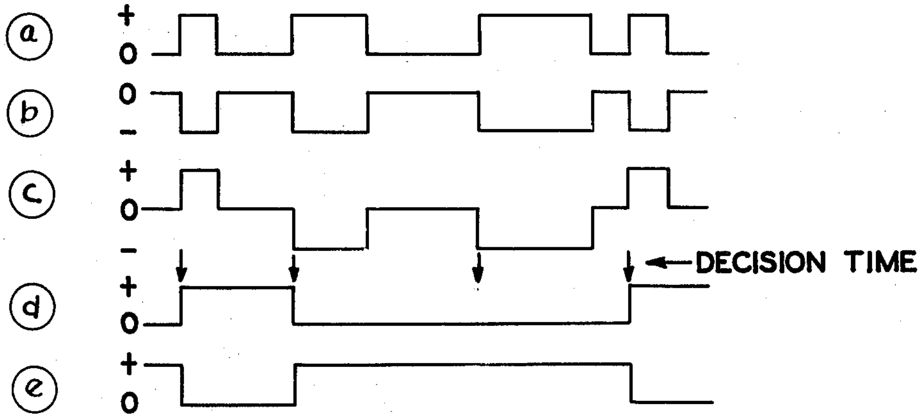
FIG. 2 are curves which are helpful in understanding the operation of FIG. 1.

In FIG. 2 is seen the various waveforms appearing at different parts of the circuit shown in FIG. 1. Thus, FIG. 2A shows the data waveform presented to the input of the circuit in FIG. 1. FIG. 2B shows the output of inverter and bias shifter 12 in FIG. 1 which is the negative image of the signal in FIG. 2A and not merely the logical inverse thereof. FIGS. 2D and 2E are the two outputs from decision logic 10 on the random probability as hereinbefore described. The waveforms representative of FIGS. 2D and 2E are presented to transmission gates 14 and 16 to selectively enable these gates to generate the three-level non-synchronous signal as shown in FIG. 2C.

Figure 3:
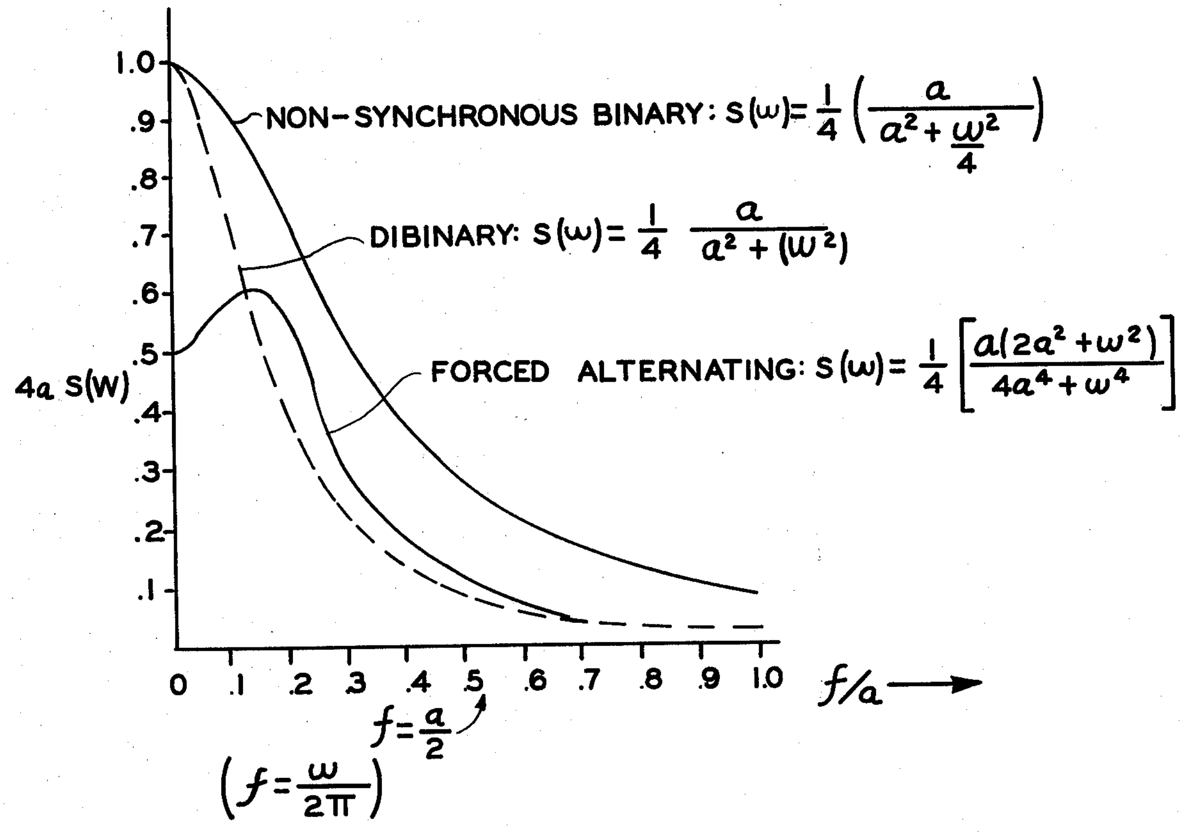
FIG. 3 is a curve showing the relative performance of various data systems.

In FIG. 3 is shown the spectra of random waveforms of the various level signals. If the transitions of the input waveform are Poisson distributed the power density spectrum of the input is given by $$S(w) = \frac{1}{4}\left(\frac{a}{a^2 + \frac{W^2}{4}}\right) \quad (1)$$

where $a$ = average number of transitions per unit time $w$ = angular frequency = $2\pi f$.

Under the same conditions it can be shown that the power density spectrum of the output waveform is given by $$S(w) = \frac{1}{4}\left(\frac{a}{a^2 + w^2}\right) \quad (2)$$

Equation 1 applies to a two level waveform centered about zero. A term representing a direct current component would appear, however, for a two level waveform not centered about zero. For convenience this term is ignored here without affecting the conclusions.

As expected, the three-level signal has no DC component. Equations 1 and 2 are plotted in FIG. 3 in normalized form to show the relative power density spectrum of input two-level signals and output three-level signals. Although neither of these spectra theoretically ever reach zero power level, it can be seen at any given power level the three-level dibinary waveform has half the bandwidth of the two-level waveform. This reduction in bandwidth should theoretically improve the performance obtainable with certain channel conditions at a given data rate, or should allow an increase in data rate for a given performance. However, since the margin against noise and distortion is decreased as the number of levels is increased, assuming equal amplitude peak to peak signals, it must also be expected that under certain channel conditions the performance, i.e. data rate capability, will be worse. This situation is illustrated in FIG. 4.

Figure 4:
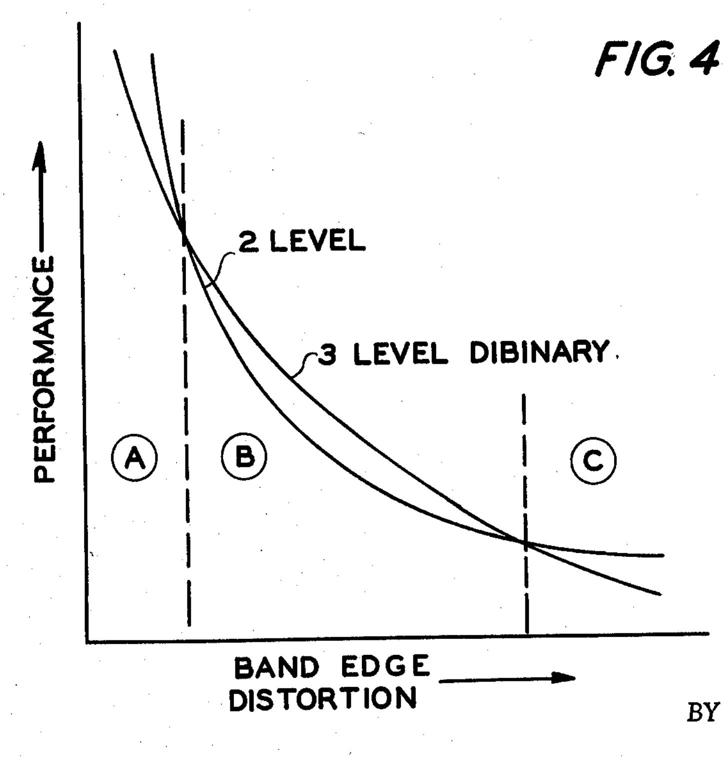
FIG. 4 is a curve showing the expected relative performance of two level and three level data signals.

Area A in FIG. 4 represents a channel in which neither spectra is distorted. Two-level performance is better because of the greater noise margin. Area B represents a channel with significant band edge distortion which is damaging to the two-level signal but not the three-signal because of its narrower spectrum. The three-level signal thus gives better performance. Area C represents a channel which had band edge distortion so severe that it is damaging to both signals. Two-level performance is again better because of its greater noise margin, which also represents a greater margin against distortion. In many transmission channels, however, the performance falls in Area B which shows that three-level signals do in fact give better performance with increasing band edge distortion.

The above paragraphs have shown the relationship of base band encoding to low pass spectra and low pass channels. These relationships are translated to band pass spectra and band pass channels when the base band waveforms are used to modulate a carrier. In general, the same benefits accrue, i.e., the information power is more closely associated with the carrier frequency, which is analogous to the DC frequency reference of the base band signal, and thus the detrimental effects of certain band edge distortions are reduced.

A three-level waveform can also be generated by electing to reverse the polarity of a binary waveform at every positive going transition of the original two-level waveform. This type of waveform can be called "forced-alternating", for example. If the transitions of the input waveform are Poisson distributed, the power spectral density of the three-level waveform is given by $$S(w) = \frac{1}{4}\left[\frac{a\,(2a^2 + w^2)}{\{a^2 + (a-w)^2\}\,\{a^2 + (a+w)^2\}}\right] \quad (3)$$

where the parameters are as defined previously. This spectrum, also plotted on FIG. 3 shows a shift of energy towards zero frequency but a maximum at about 0.145 of the average transition rate instead of at frequencies approaching zero. The benefit in avoiding band edge distortion would therefore probably not be as great but the implementation is simpler.

Figure 5:
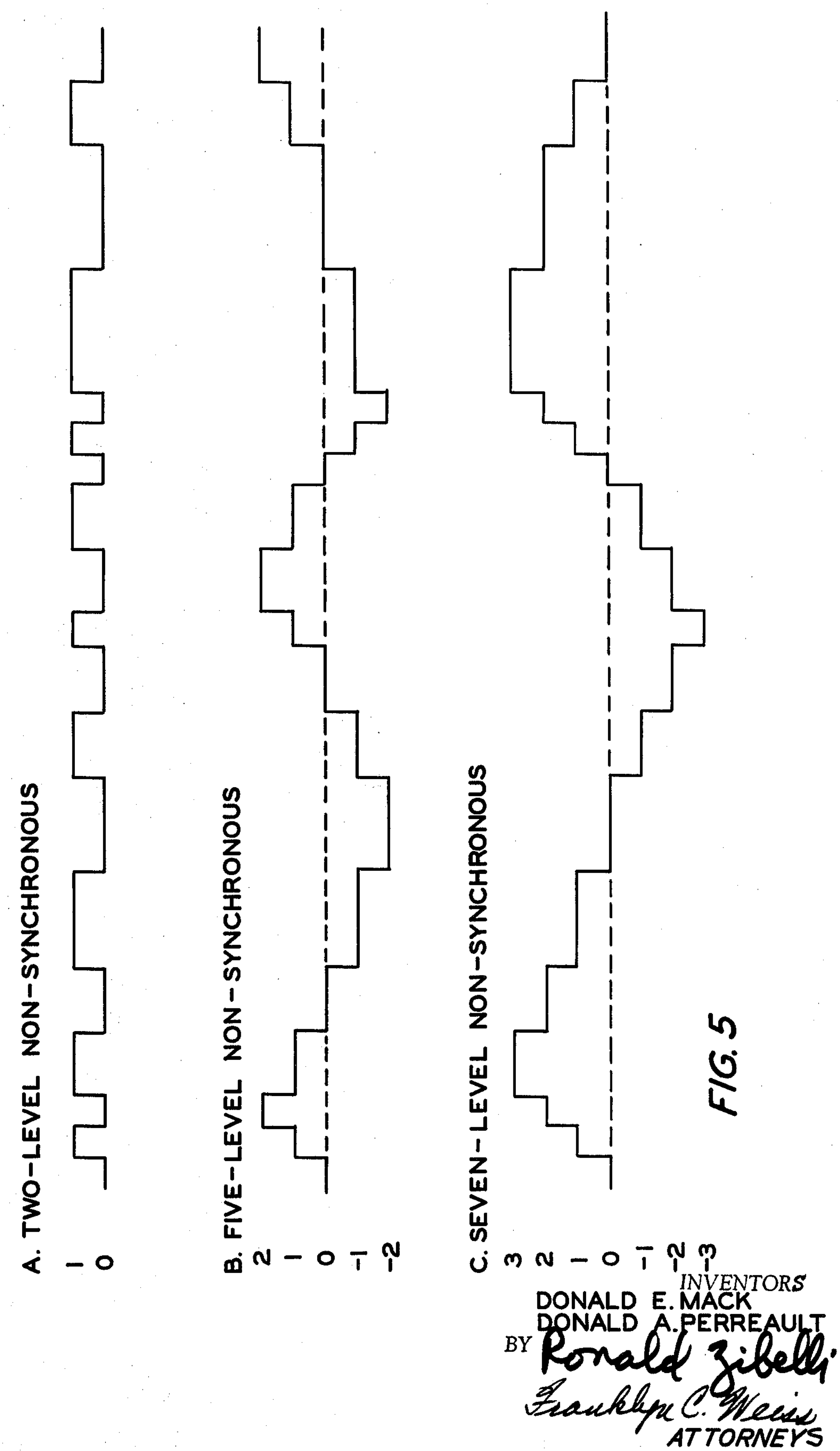
FIG. 5 are curves showing various non-synchronous multilevel waveforms.

A waveform with more than three levels can be produced if each positive transition produces a change in level and each negative transition produces a change to the next level in staircase fashion until a limit is reached at which point the direction of change is reversed. The process continues until the opposite limit has been reached and then reverses again, and so on. Two examples are shown in FIGS. 5B and 5C for a two-level non-synchronous input waveform at FIG. 5A. A five-level non-synchronous waveform is shown in FIG. 5B and a seven-level non-synchronous waveform is shown in FIG. 5C. It is seen that the odd levels correspond to positive portions of the original binary form whereas the even levels correspond to the zero-level portions of the original waveform.

Figure 6:
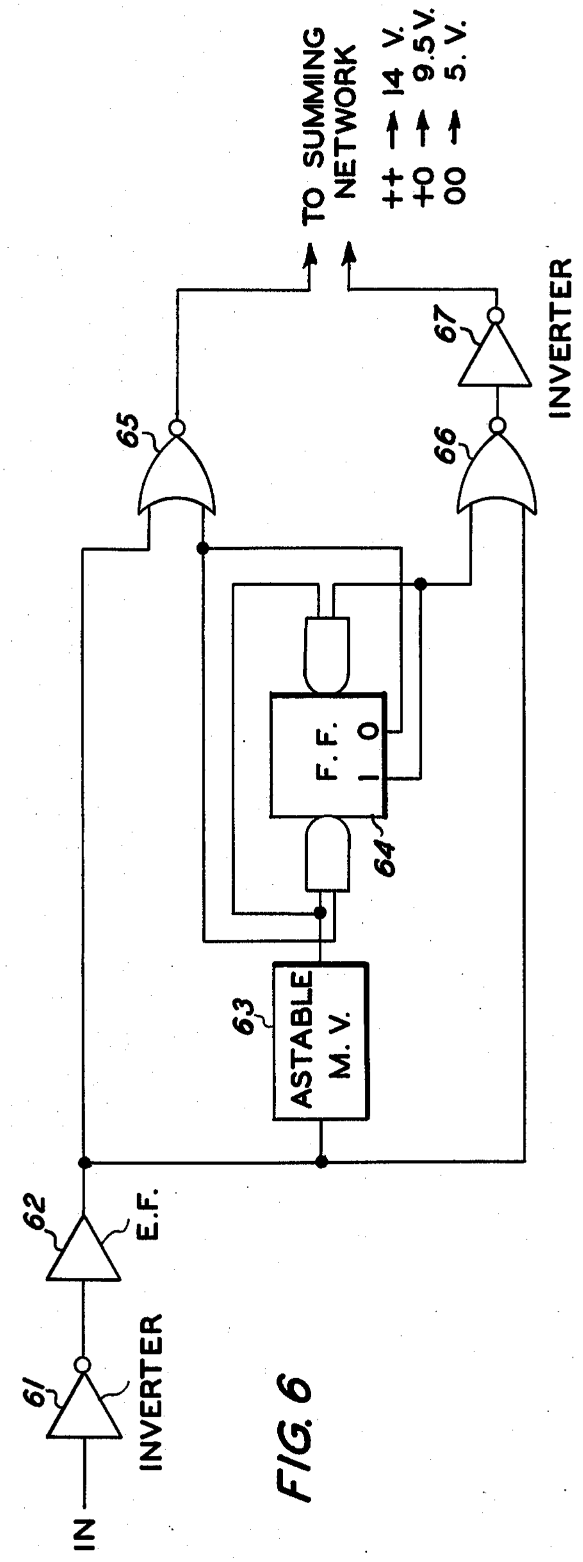
FIG. 6 is a specific diagram of an embodiment of the present invention.

The circuit shown in FIG. 6 is used to produce the spectrum given by equation 2 above. The two-level input signal is inverted by inverter 61 and coupled to subsequent circuits through emitter follower 62. When the input signal is zero, the inverted waveform is positive and the multivibrator 63 runs at its natural frequency, for example, 50 kilohertz. When the input signal is positive, the inverted signal is zero and the multivibrator 63 is off. The flip-flop 64 is driven by the multivibrator 63 and is on for odd counts and off for even counts. At the end of a zero portion of the input waveform the flip-flop 64 remains on or off according to whether the count was odd or even. The upper gate 65 produces a positive output when its inputs are both zero, i.e. when the signal input is positive and the flip-flop 64 is on. The lower gate 66 produces a positive output when the signal input is positive and the flip-flop 64 is off.

The output of the lower gate 66 is then inverted by inverter 67. The two outputs are summed in a summing circuit not shown to produce a three-level signal centered about, for example, +9.5 volts with a positive level of +14 volts and a negative level of +5 volts. The net result is a +14 volt output for a positive input and odd count, starting from off, a +9.5 volt output when the input is zero, and a +5 volt output when the input is positive and the count is even, starting from off. These voltages are exemplary only and other voltage ranges can be utilized without deviating from the principles of the present invention.

This logic can be shown by the following table:

LOGIC STATES

| | | | |
|---|---|---|---|
| Input Signal | + | | 0 |
| Inverted Input | 0 | | + |
| Multivibrator 63 | OFF | | ON |
| Flip-flop 64 | ON | OFF | ON/OFF |
| Upper Gate 65 Output | + | 0 | 0 |
| Lower Gate 66 Output | 0 | + | 0 |
| Lower Gate Inverted 67 | + | 0 | + |
| Combined Output | +14 | +5 | +9.5 |

Note that the required probability for the polarity decision is achieved through the use of a long count of the high speed clock, i.e., if the count is long enough the probability that the count is even is equal to the probability that it is odd. It is not necessary to reset the flip-flop for each counting run since if the count is long enough it is immaterial in which state it started in.

Figure 7:
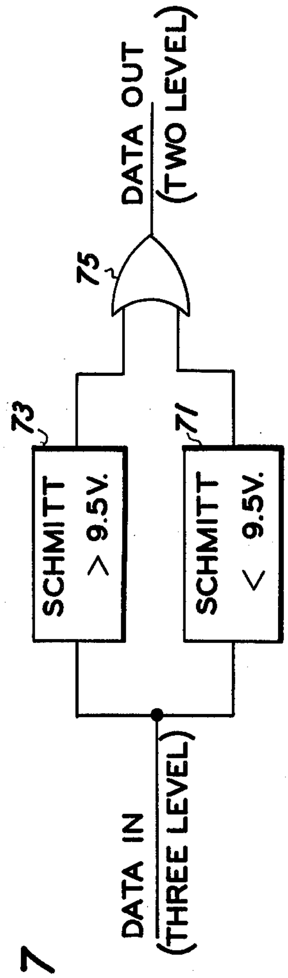
FIG. 7 is a block diagram of one technique used in decoding the signals generated in FIG. 6.

FIG. 7 shows the circuitry necessary for decoding the input three-level non-synchronous signals at a decoding location. Schmitt triggers 71 and 73 with levels set at the data transmission voltage level, in this case 9.5 volts is utilized to convert three-level information to a two-level information signal. Thus, Schmitt trigger 71 emits a signal for every signal less than 9.5 volts, while Schmitt trigger 73 emits a signal for every input signal over or greater than 9.5 volts. The output from OR gate 75 is thus the original two-level binary waveform.

It must be stated, however, that if the input data is non-random in such a way that the frequency of occurrence of the transitions has certain relationships to the clock frequency, the polarity decision becomes non-random and the expected spectrum is not achieved. This might occur in facsimile transmission when a series of equally spaced vertical lines are scanned horizontally. This phenomenon can be observed when clocked data is used as the input. It is problematical whether or not the output of a scanner actually scanning graphic lines will be regular enough to cause this phenomenon. The phenomenon, however, could probably be reduced or eliminated by raising the clock rate beyond the accuracy capability of the scanner or by jittering the clock with random noise.

Figure 8:
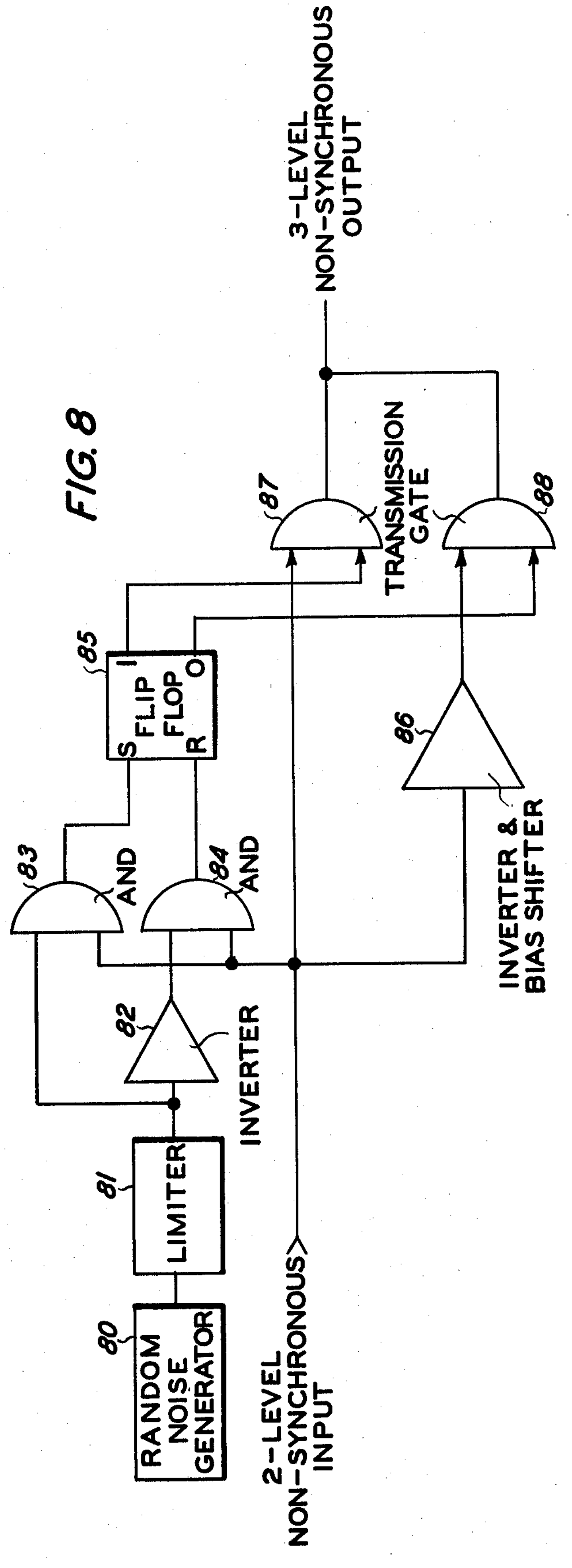
FIG. 8 is another embodiment of the present invention.

In FIG. 8 is shown another embodiment of the present invention which would not be sensitive to patterns. A random noise generator 80 whose output is positive or negative with equal probability is used to set or reset a flip-flop 85 when a positive going transition occurs in the input waveform. That is, the output of the random noise generator 80 passes through limiter 81 to AND gate 83 and through inverter 82 to AND gate 84. A two-level non-synchronous input is applied to the inputs of AND gates 83 and 84 selectively enabling such AND gates in accordance with the random input signals. Flip-flop 85 is set and reset accordingly, and thus the two-level non-synchronous input signal is applied to AND gate 87 and through inverter and bias shifter 86 to gate 88, which gates are selectively enabled thereby to generate the three-level non-synchronous output signals as seen above in conjunction with FIG. 6.

Figure 9:
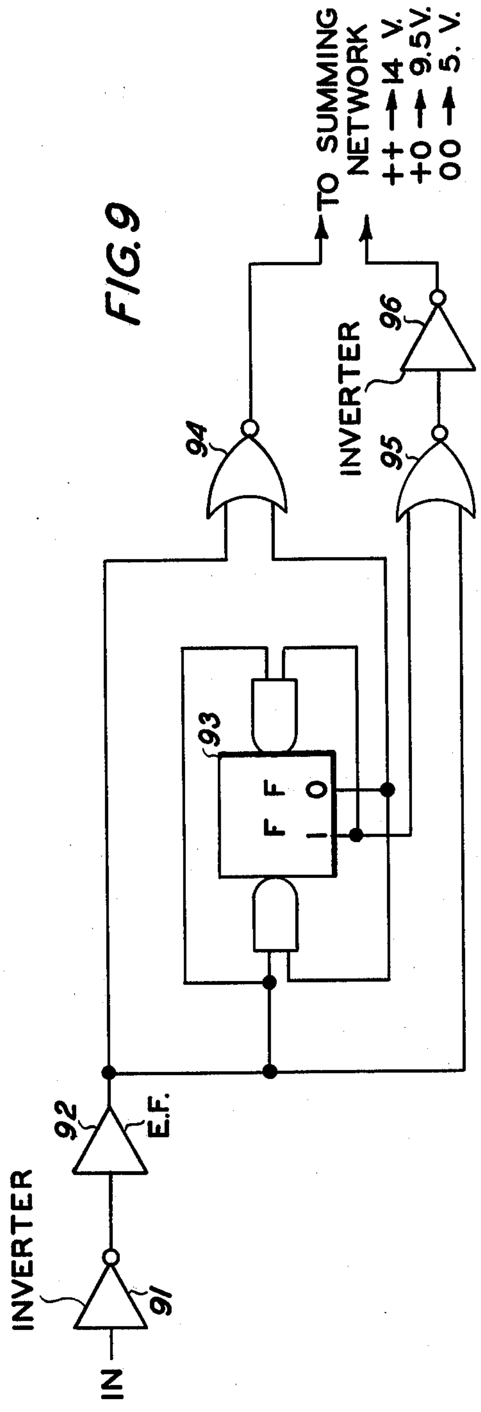
FIG. 9 is a further embodiment of the present invention.

FIG. 9 shows the circuitry used to produce the spectrum for the random alternating waveform given by equation 3. This is the same circuit as shown in FIG. 6 except that the astable multivibrator has been removed and the inverse of the input data is connected directly to flip-flop 93. Thus, the input two-level waveform is applied to inverter 91 and through emitter follower 92 applied to the input of NOR gate 94, input to flip-flop 93, and an input to NOR gate 95. The operation is the same as described in conjunction with FIG. 6 except that the flip-flop 93 now changes state at the beginning of each zero-level portion of the input waveform. The portions of the output waveform corresponding to the positive portions of the input waveform therefore alternate in polarity while the zero-level remains unchanged. The output from NOR gate 95 through inverter 96 is presented to a summing network, not shown, as is the output of NOR gate 94. The result is the three-level non-synchronous waveform with a power density spectrum given by equation 3 above.

In the foregoing, there has been disclosed methods and apparatus for shifting the power density spectrum to lower frequencies to thereby more efficiently utilize a band limited channel. While the disclosed circuits have been described in conjunction with specific logic circuitry, such circuitry is exemplary only as other circuits and apparatus could be utilized to perform the disclosed functions. Thus, while the present invention as to its objects and advantages, as described herein, has been set forth as specific embodiments thereof, they are to be understood as illustrative only and not limiting.

We claim:

1. In a data transmission system, the method of converting input non-synchronous two-level data to non-synchronous three-level data comprising the steps of:

generating a negative image of said two-level data, and transmitting according to a predetermined probability factor either said input two-level data or said negative image two-level data, respectively, in response to a control signal embodying said predetermined probability factor independent of any of the characteristics of said two-level data.

2. The method as set forth in claim 1 wherein said probability factor is 0.5.

3. In a data transmission system, the method of converting input non-synchronous two-level data to non-synchronous three-level data comprising the steps of:

generating a negative image of said two-level data, and transmitting according to a predetermined probability factor either said input two-level data or said negative image two-level data, respectively, in response to a control signal embodying said predetermined probability factor, said probability factor being dependent upon the statistical probability of occurrence of transitions in said control signal.

4. The method as set forth in claim 1 wherein said two-level data and said negative image two level data are transmitted alternately at a probability factor of 1.

5. A data transmission system comprising:

a source of input two-level non-synchronous data signals, means for generating a negative image of said two-level data signals, and means for transmitting according to a predetermined probability factor either said two-level data signals or said negative image two-level data signals, respectively, as three-level data signals in response to a control signal embodying said predetermined probability factor, said probability factor being independent of any of the chararcteristics of said input two-level data, and said three-level data signals having a predetermined power density spectrum in direct relation to the power density spectrum of said input two-level data signals.

6. The system as set forth in claim 5 wherein said probability factor is 0.5.

7. The system as set forth in claim 5 further including means for generating said control signal to thereby enable said transmitting means according to said predetermined probability factor.

8. The system as set forth in claim 7 wherein said generating means comprises noise generating means for generating random signals with an equal probability of being positive or negative, gating means responsive to said random transition signals and said two-level data signals for generating enabling signals for each positive going transition in said two-level data signals, and flip-flop switching means coupled to said gating means being set or reset in response to said enabling signals to generate said control signals to enable said transmitting means.

9. A data transmission system comprising:

a source of two-level non-synchronous data signals, means for generating first and second enabling signals in response to said two-level data signals, said generating means comprising switching means responsive to the zero level portions of said two-level non-synchronous data signals, and means for transmitting said two-level data signals as three-level data signals in response to said first and second enabling signals, said transmitting means comprising gating means coupled to said two-level non-synchronous data signal source and said switching means for transmitting the positive portions of the two-level data waveform alternate in polarity about said zero level portions to generate said three-level data signal, said three-level data signals having a predetermined power density spectrum in direct relation to the power density spectrum of said two-level data signals.

10. A data transmission system comprising:

a source of two-level non-synchronous data signals, means for generating first and second enabling signals in response to said two-level data signals, said generating means comprising multivibrator means responsive to said two-level data signals and being enabled when said two-level data signal is zero and disabled when said two-level data signal is positive, and switching means coupled to said multivibrator means for generating a signal of a first polarity at an odd count of signals from said multivibrator means and for generating a signal of a second polarity at an even count of signals from said multivibrator means, and means for selectively transmitting said two-level data signals in response to said first and second enabling signals, respectively, said transmitting means comprising gating means coupled to said two-level non-synchronous data signal source and said switching means for transmitting the positive portions of said two-level data waveform varying in polarity to generate three-level data signals, said three-level data signals having a predetermined power density spectrum in direct relation to the power density spectrum of said two-level data signals.

11. The system as set forth in claim 10 wherein said three-level data waveform has a power density spectrum of $$S(w) = \frac{1}{4}\left(\frac{a}{a^2 + w^2}\right)$$

where $a$ = average number of transitions per unit time and $w$ = angular frequency, when the transitions of said two-level data signals are Poisson distributed.

12. In a data transmission system, the method of converting non-synchronous two-level data into non-synchronous multi-level data of more than three levels comprising the steps of:

first successively changing the level of the multi-level data waveform for each positive transition and negative transition in said two-level data in staircase fashion to a first level limit in the multi-level data waveform, said multi-level data being greater than three-levels, and second successively changing the level of the multi-level data waveform for each positive transition and negative transition in said two-level data in staircase fashion from said first level limit to a second level limit in the multi-level waveform.

13. In a data transmission system, the method of converting input non-synchronous two-level data into non-synchronous three-level data comprising the steps of:

generating a negative image of said input two-level data, and transmitting either said two-level data or said negative image two-level data, respectively, according to the characteristics of a random transition control signal of predetermined probability factor independent of the characteristics of said two-level data.

14. In a data transmission system, the method of converting non-synchronous two-level data into non-synchronous three-level data comprising the steps of:

generating first and second enabling signals in response to said two-level data signals, said step of generating comprising switching at transitions of like polarity of said two-level non-synchronous signals, and transmitting the positive portions of the two-level data waveform alternate in polarity about said zero level in response to said first and second enabling signals to generate said three-level data signal.

15. A data transmission system comprising:

a source of two-level non-synchronous data signals, means for generating first and second enabling signals in response to said two-level data signals, said generating means comprising means for switching at transitions of like polarity of said two-level non-synchronous data signals, and means for transmitting said two-level data signals as three-level data signals in response to said first and second enabling signals, said transmitting means comprising gating means coupled to said two-level non-synchronous data signal source and said switching means for transmitting the positive portions of the two-level data waveform alternate in polarity about said zero level portions.

16. In a data transmission system, the method of converting non-synchronous two-level data into non-synchronous three-level data comprising the steps of:

generating first and second enabling signals in response to said two-level data signals by switching at the transitions of one of said two-level portions to the other of said two-level portions of said two-level non-synchronous data signals, and transmitting said two-level data signals in response to said first and second enabling signals by gating the positive portions of the two-level data waveform alternate in polarity about said zero level portions.

17. In a data transmission system, the method of converting non-synchronous two-level data into non-synchronous three-level data comprising the steps of:

generating first and second enabling signals in response to said two-level data signals, said step of generating comprising enabling a multivibrator circuit when said two-level data signal is zero and disabling said multivibrator circuit when said two-level data signal is positive, further generating a signal of a first polarity at an odd count of signals from said multivibrator circuit and further generating a signal of a second polarity at an even count of signals from said multivibrator circuit, and transmitting said two-level data signals in response to said first and second enabling signals, said step of transmitting comprising gating the positive portions of said two-level data waveform varying in polarity to generate said three-level data signals, said three-level data signals having a predetermined power density spectrum in direct relation to the power density spectrum of said two level data signals.

18. In a facsimile system wherein copy is scanned to produce an analog signal train representative thereof, a system for reducing the bandwidth required for transmitting said analog signal train without clocking comprising:

means for converting said analog signal train to a two amplitude level analog pulse train wherein each analog signal in said analog signal train exceeding a predetermined amplitude is converted to an analog pulse having one amplitude level and the same time duration as the analog signal from which it is derived exceeds said predetermined amplitude and each analog signal in said analog signal train which does not exceed said predetermined level is converted to a pulse having a second amplitude level and the same duration as the analog signal from which it is derived, means to which said two amplitude level analog pulse train is applied for inverting the phase of alternate pulses having said one amplitude level to a phase opposite to that of the remaining pulses having said one amplitude level while retaining the same time duration as the pulse from which it is derived, to provide a three amplitude level analog pulse train, means for transmitting said three amplitude level analog pulse train, means for receiving said three amplitude level analog pulse train, means for converting said received pulse train to a two amplitude level analog pulse train, and means for utilizing said two amplitude level analog pulse train for reproducing the copy which was scanned.

19. A facsimile system as recited in claim 18 wherein said means to which said two amplitude level analog pulse train is applied for inverting the phase of alternate pulses having said one amplitude level to a phase opposite to that of the remaining pulses having said one amplitude level to provide a three amplitude level analog pulse train comprises:

a first disenabled gate means, a second disenabled gate means, phase inverter means connected to said second disenabled gate means output, means for applying said two level pulse train simultaneously to said first and second disenabled gate means inputs, means responsive to successive pulses in said two level pulse train for alternately enabling said first and second disenabled gate means, and means for combining the outputs of said first disenabled gate means and said phase inverter means to produce a three level analog pulse train having phase inverted alternate pulses.

20. A system as recited in claim 19 wherein said means responsive to successive pulses in said two level pulse train for alternately enabling said first and second disenabled gate means includes a flip-flop circuit means having first and second outputs connected to said respective first and second gate means inputs for alternatively energizing said first and second gate means responsive to successive pulses.

21. A method of reducing the bandwidth required for transmitting an analog signal train derived from scanning copy in a facsimile system without clocking comprising:

converting said analog signal train to a two amplitude level unclocked analog pulse train wherein analog signals in said train exceeding a predetermined amplitude level are represented by pulses having one of said two amplitude levels and a pulse width determined by the interval during which the analog signals from which it is derived exceeds said predetermined amplitude level, and analog signals not exceeding said predetermined level are converted to pulses having a second amplitude level and a pulse width determined by the interval over which said analog signals from which they are derived do not exceed said predetermined level, inverting the phase of alternate pulses in said two amplitude level unclocked analog pulse train while preserving their pulse width to produce a three amplitude level unclocked analog pulse train, transmitting said three amplitude level analog pulse train, receiving said three amplitude level unclocked analog pulse train, and utilizing said received three amplitude level analog pulse train for reconstructing said scanned copy.

22. In a facsimile system wherein copy is scanned for generating an analog signal train representing each scanning line, a method of reducing the bandwidth required for transmitting said analog signal train without signal clocking comprising:

converting said analog signal train to a two amplitude level unclocked analog pulse train wherein analog signals exceeding a predetermined amplitude level are represented by pulses having one amplitude level and a pulse width determined by the interval over which the analog signal it represents exceeds said predetermined amplitude level and the analog signals not exceeding said predetermined level are represented by pulses having a second amplitude level and a pulse width determined by the interval over which said predetermined level is not exceeded, applying said two amplitude level unlocked analog pulse train to a first and second blocked path, successively alternately unblocking said first and second blocked paths responsive to successive one amplitude level pulses in said two amplitude level unclocked analog pulse train, phase inverting each one amplitude level pulse in said first blocked path, adding the outputs from said first and second blocked paths to produce a three level unclocked analog pulse train, transmitting said three level analog unclocked pulse train, receiving said transmitted three level unclocked analog pulse train, converting said three level analog unclocked pulse train back to said two amplitude level unclocked analog pulse train, and utilizing said two amplitude analog unclocked pulse train for reproducing said original copy.

* * * * *

UNITED STATES PATENT AND TRADEMARK OFFICE

CERTIFICATE OF CORRECTION

PATENT NO. : 3,876,944

DATED : 4/8/75

INVENTOR(S) : Donald E. Mack/Donald A. Perreault

It is certified that error appears in the above-identified patent and that said Letters Patent are hereby corrected as shown below:

Column 9, line 42 - Column 10, line 7 should read as follows:

18. In a facsimile system wherein copy is scanned to produce a two amplitude level analog pulse train representative thereof, a system for reducing the bandwidth required for transmitting said two amplitude level analog pulse train without clocking comprising:

means to which said two amplitude level analog pulse train is applied for inverting the phase of alternate pulses having said one amplitude level to a phase opposite to that of the remaining pulses having said one amplitude level while retaining the same time duration as the pulse from which it is derived, to provide a three amplitude level analog pulse train, means for transmitting said three amplitude level analog pulse train, means for receiving said three amplitude level analog pulse train, means for converting said received pulse train to a two amplitude level analog pulse train, and means for utilizing said two amplitude level analog pulse train for reproducing the copy which was scanned.

Column 10, line 37 - Column 10, line 65 should read as follows:

21. A method of reducing the bandwidth required for transmitting a two amplitude level unclocked analog pulse train derived from scanning copy in a facsimile system without

UNITED STATES PATENT AND TRADEMARK OFFICE

CERTIFICATE OF CORRECTION

PATENT NO. : 3,876,944

DATED : 4/8/75

INVENTOR(S) : Donald E. Mack/Donald A. Perreault

It is certified that error appears in the above-identified patent and that said Letters Patent are hereby corrected as shown below:

Column 10, line 37 - Column 10, line 65 (Continued)

clocking comprising:

Inverting the phase of alternate pulses in said two amplitude level unclocked analog pulse train while preserving their pulse width to produce a three amplitude level unclocked analog pulse train, transmitting said three amplitude level analog pulse train, receiving said three amplitude level unclocked analog pulse train, and utilizing said received three amplitude level analog pulse train for reconstructing said scanned copy.

Column 10, line 66 - Column 12, line 17, should read as follows:

22. In a facsimile system wherein copy is scanned for generating a two amplitude level unclocked analog pulse train representing each scanning line, a method of reducing the bandwidth required for transmitting said analog pulse train without signal clocking comprising:

applying said two amplitude level unclocked analog pulse train to a first and second blocked path, successively alternately unblocking said first and second blocked paths responsive to successive one amplitude level pulses in said two amplitude level unclocked analog pulse train,

UNITED STATES PATENT AND TRADEMARK OFFICE

CERTIFICATE OF CORRECTION

PATENT NO. : 3,876,944

DATED : 4/8/75

INVENTOR(S) : Donald E. Mack/Donald A. Perreault

It is certified that error appears in the above-identified patent and that said Letters Patent are hereby corrected as shown below:

Column 10, line 66 - Column 12, line 17 (Continued)

phase inverting each one amplitude level pulse in said first blocked path, adding the outputs from said first and second blocked paths to produce a three level unclocked analog pulse train, transmitting said three level analog unclocked pulse train, receiving said transmitted three level unclocked analog pulse train, converting said three level analog unclocked pulse train back to said two amplitude level unclocked analog pulse train, and utilizing said two amplitude analog unclocked pulse train for reproducing said original copy.

Signed and Sealed this

*fourteenth* Day of *October 1975*

[SEAL]

*Attest:*

RUTH C. MASON
*Attesting Officer*

C. MARSHALL DANN
*Commissioner of Patents and Trademarks*